United States Patent
Nimura et al.

(10) Patent No.: US 9,953,844 B2
(45) Date of Patent: Apr. 24, 2018

(54) MANUFACTURING METHOD OF SEMICONDUCTOR PACKAGE

(71) Applicant: Mitsubishi Electric Corporation, Tokyo (JP)

(72) Inventors: Masanori Nimura, Tokyo (JP); Shigenori Takeda, Tokyo (JP); Yoshinao Tatei, Tokyo (JP); Ikio Sugiura, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 182 days.

(21) Appl. No.: 14/787,798

(22) PCT Filed: Jun. 9, 2014

(86) PCT No.: PCT/JP2014/065267
§ 371 (c)(1),
(2) Date: Oct. 29, 2015

(87) PCT Pub. No.: WO2015/189903
PCT Pub. Date: Dec. 17, 2015

(65) Prior Publication Data
US 2016/0163565 A1  Jun. 9, 2016

(51) Int. Cl.
*H01L 21/48* (2006.01)
*H01L 23/13* (2006.01)
(Continued)

(52) U.S. Cl.
CPC ........ *H01L 21/4817* (2013.01); *H01L 21/288* (2013.01); *H01L 21/4803* (2013.01);
(Continued)

(58) Field of Classification Search
CPC . H05K 1/03; H05K 13/00; B32B 3/26; B32B 9/00; H01L 21/288; H01L 21/4803;
(Continued)

(56) References Cited

U.S. PATENT DOCUMENTS 5,838,063 A * 11/1998 Sylvester ................ H01L 23/10
257/678
5,868,887 A * 2/1999 Sylvester .............. H01L 23/145
156/150

(Continued)

FOREIGN PATENT DOCUMENTS

JP  02-005014 A  1/1990
JP  08-148602 A  6/1996
(Continued)

OTHER PUBLICATIONS

International Search Report for PCT/JP2014/065267 dated Aug. 26, 2014.
(Continued)

*Primary Examiner* — Carl Arbes
(74) *Attorney, Agent, or Firm* — Sughrue Mion, PLLC; Richard C. Turner

(57) ABSTRACT

When a plating layer is formed on through holes in semiconductor packages, first and second stacked bodies are stacked with first and second cavities formed in the first and second stacked bodies facing the inner side and are bonded together by applying adhesive to peripheral regions so that the cavities of the first and second stacked bodies form sealed spaces, and the through holes are formed such that part of the first and second stacked bodies including the bonding surface remains. Then, the through holes are plated to form the plating layer, the peripheral regions are removed as cutting allowances, i.e., removal regions, and the first and second stacked bodies are divided into a plurality of pieces along dicing lines to form semiconductor packages.

9 Claims, 14 Drawing Sheets

(51) Int. Cl.
  *H01L 23/498* (2006.01)
  *H01L 21/288* (2006.01)
  *H01L 23/055* (2006.01)
  *H01L 23/08* (2006.01)

(52) U.S. Cl.
  CPC ........ *H01L 21/486* (2013.01); *H01L 21/4857* (2013.01); *H01L 23/055* (2013.01); *H01L 23/08* (2013.01); *H01L 23/13* (2013.01); *H01L 23/49805* (2013.01); *H01L 23/49822* (2013.01); *H01L 23/49827* (2013.01); *H01L 2924/0002* (2013.01)

(58) Field of Classification Search
  CPC ............. H01L 21/4817; H01L 21/4857; H01L 21/486; H01L 23/055; H01L 23/08; H01L 23/13; H01L 23/49806; H01L 23/49822; H01L 23/49827; H01L 2924/00; H01L 2924/0002
  See application file for complete search history.

(56) References Cited

U.S. PATENT DOCUMENTS

| | | | | |
|---|---|---|---|---|
| 5,888,630 | A * | 3/1999 | Sylvester | H01L 21/4857 257/E23.062 |
| 5,888,631 | A * | 3/1999 | Sylvester | H01L 23/3735 174/256 |
| 5,900,312 | A * | 5/1999 | Sylvester | H01L 23/055 174/255 |
| 6,014,317 | A * | 1/2000 | Sylvester | H01L 23/3735 174/260 |
| 6,121,553 | A * | 9/2000 | Shinada | H01L 23/49894 174/255 |
| 6,268,648 | B1 | 7/2001 | Fukutomi et al. | |

FOREIGN PATENT DOCUMENTS

| | | |
|---|---|---|
| JP | 9-74151 A | 3/1997 |
| JP | 2003-179180 A | 6/2003 |
| JP | 2008-124348 A | 5/2008 |
| JP | 2010-067729 A | 3/2010 |
| JP | 2010-219367 A | 9/2010 |
| JP | 2013-115325 A | 6/2013 |
| JP | 2014-67922 A | 4/2014 |
| TW | 419797 B | 1/2001 |
| TW | 201401960 A | 1/2014 |

OTHER PUBLICATIONS

Communication dated May 17, 2016 from the Taiwanese Intellectual Property Office in counterpart Application No. 104111083.
Communication dated Nov. 19, 2016, issued by the Korean Intellectual Property Office in corresponding Korean Application No. 10-2015-7031678.
Communication dated Sep. 5, 2017, from the State Intellectual Property Office of People's Republic of China in counterpart Application No. 201480025592.0.

* cited by examiner

MANUFACTURING METHOD OF SEMICONDUCTOR PACKAGE

CROSS REFERENCE TO RELATED APPLICATIONS

This application is a National Stage of International Application No. PCT/JP2014/065267 filed Jun. 9, 2014, the contents of all of which are incorporated herein by reference in their entirety.

FIELD

The present invention relates to a manufacturing method of a semiconductor package and a semiconductor package.

BACKGROUND

A conventional typical semiconductor package includes recess portions (hereinafter, referred to as semiconductor-element receiving cavities or cavities in some cases) for receiving semiconductor elements and through holes rendering respective electrode layers conductive.

Typical processes are as follows:

Process 0: form cavity holes and circuits in a plate (hereinafter, an insulating sheet) made of an insulating material Process 1: stack the insulating sheet formed in Process 0 and an adhesive layer Process 2: drill through holes Process 3: plate through holes and bottom and top surfaces of the stacked body Process 4: remove unnecessary plated portions of the bottom and top surfaces of the stacked body by etching Process 5: apply and pattern a solder resist Process 6: plate with gold Process 7: singulate by dicing However, there is a problem in that, when the through holes are plated, a plating layer adheres to the whole semiconductor-element receiving cavities; therefore, the electrodes, such as die bonding electrodes on which semiconductor elements are to be mounted and wire bonding electrodes, are short-circuited.

The following technology is disclosed in Patent Literature 1. In Patent Literature 1, a technology is proposed in that, when the through holes and the bottom and top surfaces of the stacked body are plated in Process 3 described above, in order to avoid plating from adhering to the semiconductor-element receiving cavities, the semiconductor-element receiving cavities are sealed with an insulating sheet and, after the plating process is finished, part of the insulating sheet is removed as Process 4 so as to form the semiconductor-element receiving cavities. Thereafter, singulation is performed by dicing.

CITATION LIST

Patent Literature

Patent Literature 1: Japanese Examined Patent Application Publication No. H02-5014

SUMMARY

Technical Problem

However, with the technology described in Patent Literature 1, there is a problem in that a time-consuming process is required for the removal of the insulating sheet that is used for forming the cavities, which leads to a cost increase. Moreover, there is a problem in that products become contaminated during the insulating sheet removing process. For example, when the insulating sheet is removed by machining, dust is generated. When the insulating sheet is removed by laser processing, re-solidified deposits referred to as debris are generated. In either case, the bonding reliability in the die bonding and wire bonding of the semiconductor elements is reduced. Furthermore, when an optical component, such as a lens, is arranged in the cavity opening, there is a problem in that the bonding reliability between the semiconductor package and the optical component is reduced because of burrs due to cutting or debris due to laser processing.

The present invention has been achieved in view of the above and an object of the present invention is to obtain a method of easily manufacturing, without time-consuming process, a stacked semiconductor package having a high reliability and having no risk of short-circuit due to the adhesion of plating to the inside of the cavities.

Solution to Problem

In order to solve the above problems and achieve the object, an aspect of the present invention is a manufacturing method of a semiconductor package, including: a step of forming a first stacked body including a first insulating resin plate having first and second main surfaces and a first intermediate layer that is stacked on the second main surface and that has an opening forming at least one first cavity; a step of forming a second stacked body including a second insulating resin plate having first and second main surfaces and a second intermediate layer that is stacked on the second main surface and that has an opening forming at least one second cavity; a step of selectively forming an adhesive in a peripheral region of at least one of the first and second intermediate layers and bonding the first and second intermediate layers together such that the first and second cavities are covered with each other; a step of forming a through hole on an inner side of the peripheral region, the through hole penetrating the first and second stacked bodies such that part of the first and second stacked bodies including a bonding surface therebetween remains; a step of forming a plating layer on the through hole; and a step of dividing each of the first and second stacked bodies along a dicing line that includes the through hole and penetrates the first and second stacked bodies, wherein a first package having the first cavity and a second package having the second cavity are formed.

Advantageous Effects of Invention

According to the present invention, because plating is performed in a state where the first and second cavities are closed, there is no risk of short-circuit due to the adhesion of plating to the inside of the cavities. Moreover, the first and second stacked bodies are each divided along the dicing line, which includes through holes present on the inner side of the peripheral regions and penetrates the first and second stacked bodies; therefore, after the peripheral regions are cut, the bonding surface of the first and second stacked bodies is released without contamination. Accordingly, an effect is obtained where it is possible to obtain a stacked package that is easy to manufacture and has a high reliability.

BRIEF DESCRIPTION OF DRAWINGS

FIG. 3(a) is a diagram illustrating a first stacked body, FIG. 3(b) is a diagram illustrating a release sheet, and FIG. 3(c) is a diagram illustrating a second stacked body.

FIG. 7(a) is a top view, FIG. 7(b) is a cross-sectional view taken along line $A_1$-$A_1$ in FIG. 7(a), and FIG. 7(c) is a cross-sectional view taken along line $B_1$-$B_1$ in FIG. 7(a).

DESCRIPTION OF EMBODIMENTS

Figure 1:
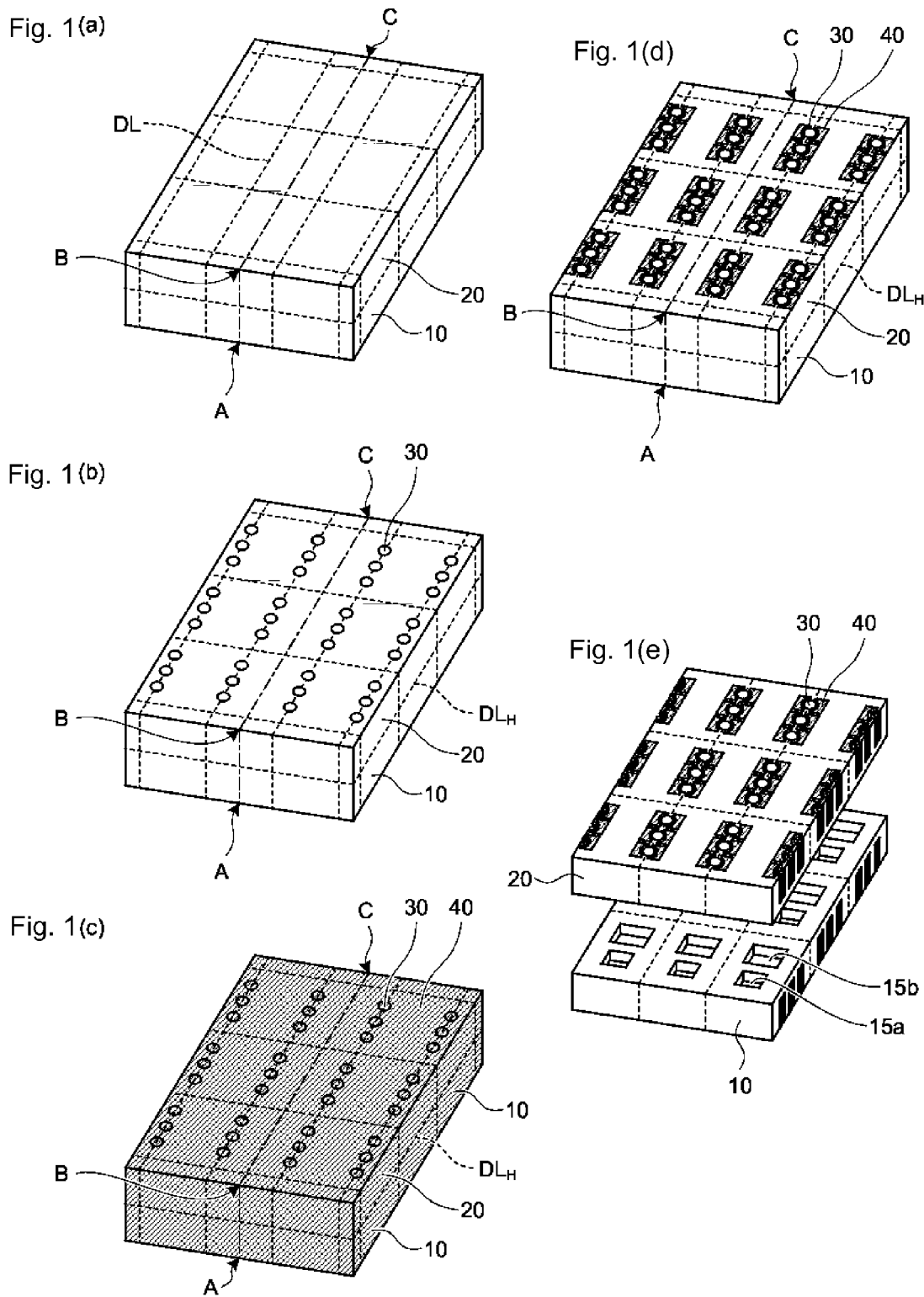
FIGS. 1(a), 1(b), 1(c), 1(d) and 1(e) are explanatory diagrams illustrating a manufacturing process of semiconductor packages according to a first embodiment.

Exemplary embodiments of a manufacturing method of a stacked semiconductor package according to the present invention will be explained below in detail with reference to the drawings. This invention is not limited to the embodiments and can be appropriately modified without departing from the scope of the present invention. In the drawings described below, for ease of understanding, scales of respective layers or respective components may be shown differently from what they actually are in reality. This holds true for the relations between the drawings too. Hatching is applied even to plan views in some cases in order to facilitate visualization of the drawings.

First Embodiment

Figure 2:
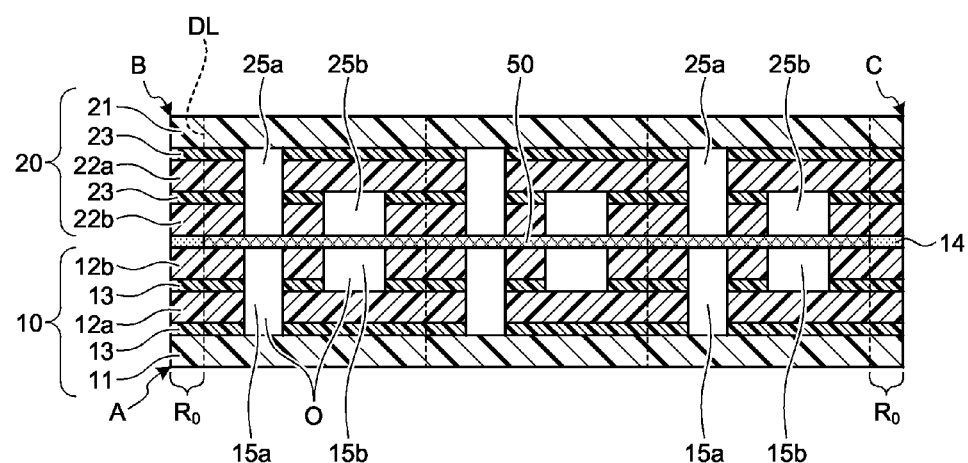
FIG. 2 is a cross-sectional view illustrating a state where the semiconductor packages are cut along line A-B-C in FIG. 1(b).
Figure 3:
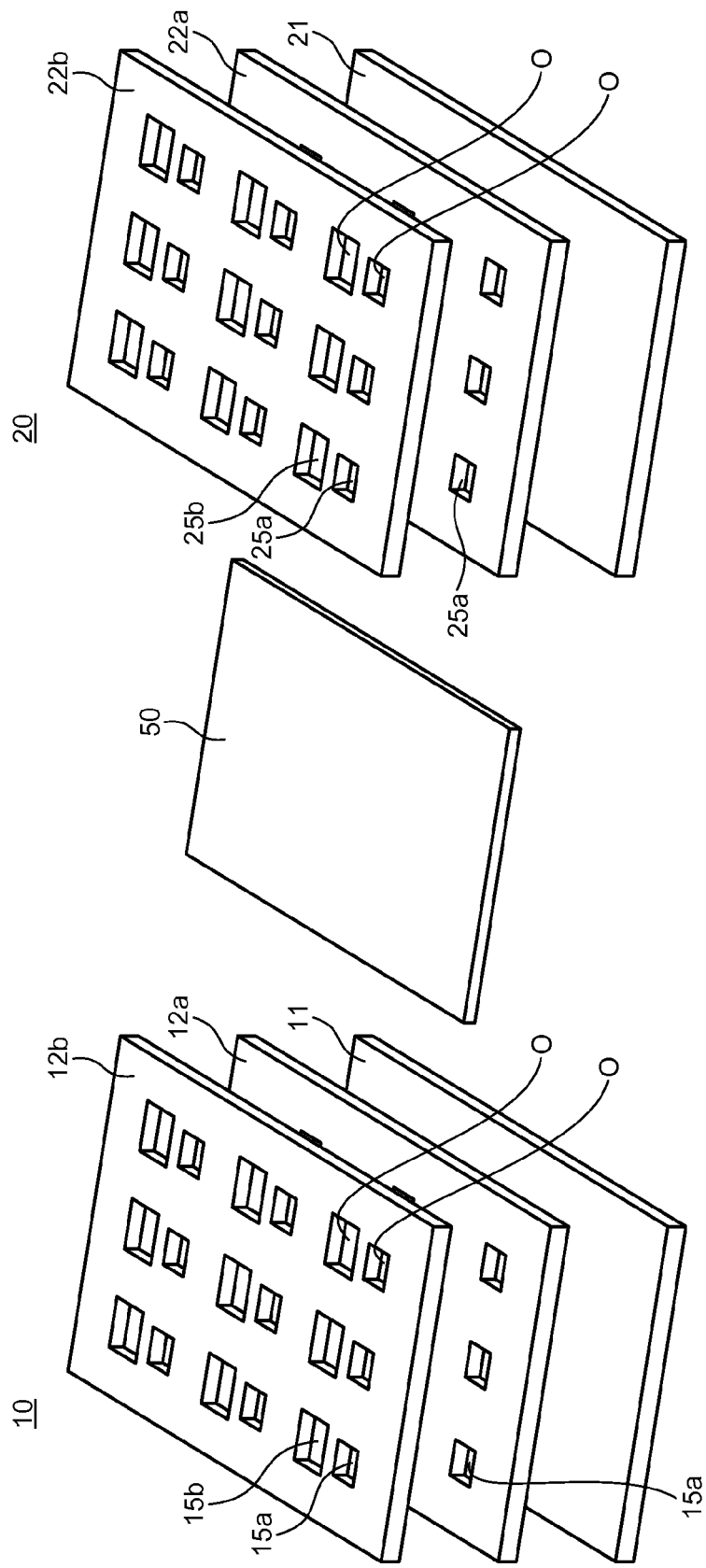
FIGS. 3(a), 3(b) and 3(c) are exploded perspective views of FIG. 2, where
Figure 4:
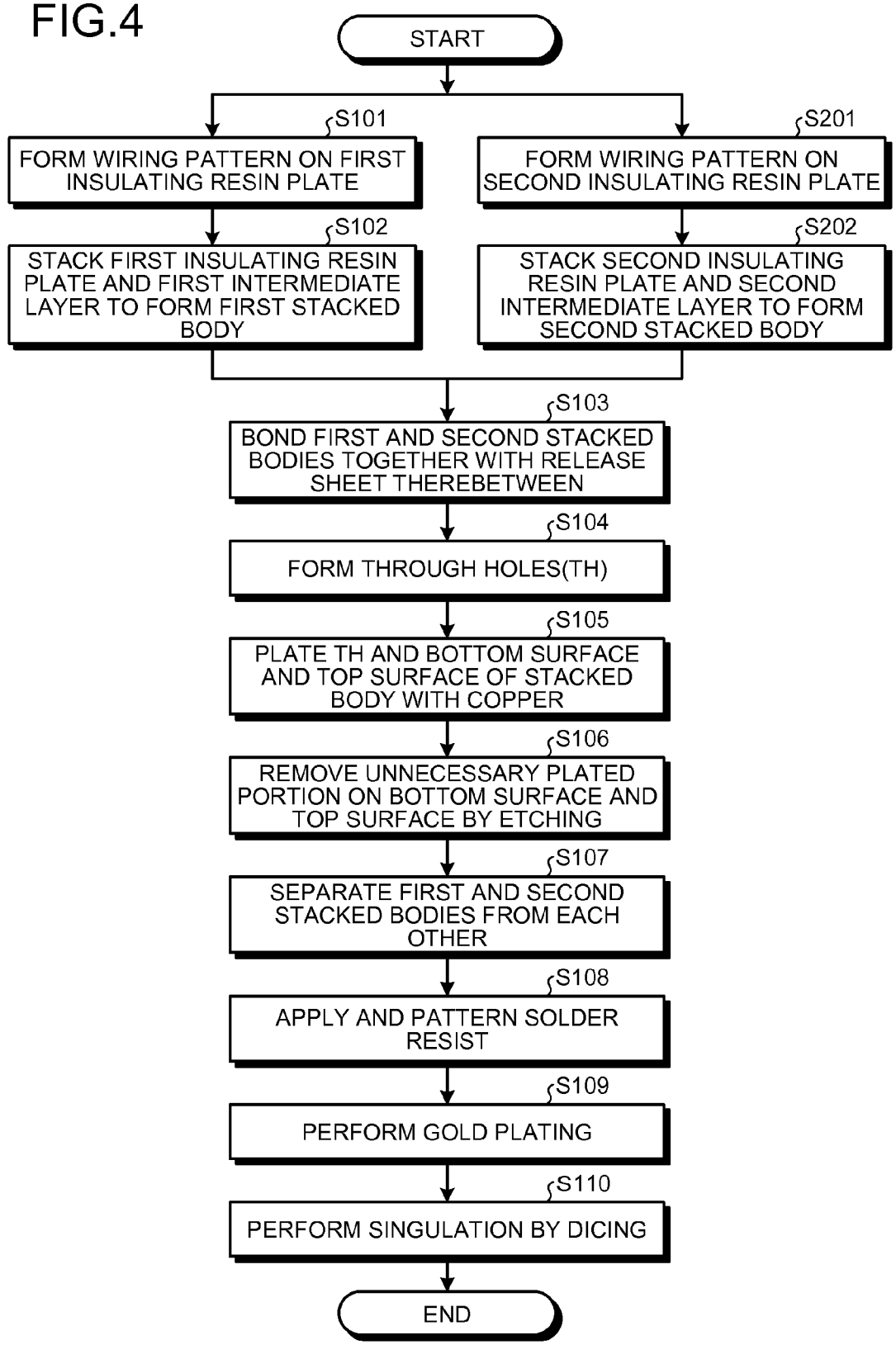
FIG. 4 is a flowchart illustrating a manufacturing process of the semiconductor packages according to the first embodiment.

FIG. 1 is a diagram illustrating a manufacturing method of stacked semiconductor packages according to a first embodiment and FIG. 2 is a cross-sectional view illustrating a state where the semiconductor packages are cut along line A-B-C in FIGS. 1(a) and 1(b). FIGS. 3(a) to 3(c) are exploded perspective views of the semiconductor packages according to the first embodiment. FIG. 4 is a flowchart illustrating a manufacturing process of the semiconductor packages according to the first embodiment.

With the method of the present embodiment, when a plating layer is formed on the through holes in the semiconductor packages, first and second stacked bodies, which are stacked plates, are stacked on each other with their cavities facing the inner side and are bonded together by applying an adhesive to the peripheral regions thereof so that the cavities of the stacked plates form sealed spaces, and then the through holes are plated, peripheral regions $R_0$ bonded with the adhesive are removed as cutting allowances, i.e., removal regions, and the first and second stacked bodies are each divided into a plurality of pieces so as to form semiconductor packages. Hereinafter, the through hole is sometimes referred to as TH for short.

As illustrated in the cross-sectional view in FIG. 2 and the exploded perspective view of the stacked bodies in FIGS. 3(a) to 3(c), a first stacked body 10, in which first intermediate layers 12a and 12b forming a two-layer structure with an adhesive layer 13 therebetween are stacked on a first insulating resin plate 11 with the adhesive layer 13 therebetween, and a second stacked body 20, in which second intermediate layers 22a and 22b formed with an adhesive layer 23 therebetween are stacked on a second insulating resin plate 21 with the adhesive layer 23 therebetween, are prepared. Then, the first and second stacked bodies 10 and 20 are bonded together with an adhesive 14 with a release sheet 50 therebetween such that first and second cavities 15a, 15b, 25a, and 25b face the inner side, whereby the cavities form sealed spaces. In a state where the cavities form sealed spaces in such a manner, through holes, i.e., through holes 30 (not illustrated in FIG. 2), are formed in the first and second stacked bodies 10 and 20 from both sides such that part of the stacked bodies including the bonding surface remains and then the through holes are plated. In the present embodiment, although the through holes 30 are formed without penetrating the bonding surface such that the bonding surface remains, they are referred to as through holes for the sake of convenience. The through holes 30 are formed by using an etching method and part of the stacked bodies can remain by controlling the temperature of the etchant and the etching time. At this point, the first and second cavities 15a, 15b, 25a, and 25b form enclosed spaces in the stacked bodies; therefore, plating does not adhere thereto. After the plating, the peripheral regions $R_0$, which are cutting allowances, are removed and the stacked bodies are separated at the border at which the adhesive disappears. The separated stacked bodies are singulated by dicing or the like along dicing lines DL, and thereby semiconductor packages having cavities are manufactured. The first and second stacked bodies 10 and 20 are separated along a separation line $DL_H$ in the horizontal direction by removing the release sheet 50.

Next, an explanation will be given in detail of the manufacturing process of the semiconductor packages according to the first embodiment with reference to the flowchart illustrated in FIG. 4. Glass epoxy plates (MCL-E679FG made by Hitachi Chemical Co., Ltd.) are used for the first and second insulating resin plates 11 and 21. As with the first and second insulating resin plates 11 and 21, glass epoxy plates (MCL-E679FG made by Hitachi Chemical Co., Ltd.) are used for the first and second intermediate layers 12a, 12b, 22a, and 22b. Epoxy adhesive films (AS-2600W made by Hitachi Chemical Co., Ltd.) are used for the adhesive layers (represented by reference numerals 13 and 23 in FIG. 2). In this embodiment, as with the adhesive layers that bond the insulating resin plates and the intermediate layers, an epoxy adhesive film (AS-2600W made by Hitachi Chemical Co., Ltd.) is used for the adhesive 14 that is used for bonding the first and second stacked bodies 10 and 20.

First, wiring patterns are formed on one side or both sides of the glass epoxy plates that are the first insulating resin plate 11 and the first intermediate layers 12a and 12b (Step S101). In this embodiment, pads 41 and 43 (not illustrated in FIG. 2, see FIGS. 7(b) and 7(c)) formed from copper wiring layer patterns are provided. Moreover, although not illustrated, through holes are provided in the first intermediate layers 12a and 12b so as to connect the wiring layers to each other. Moreover, openings O are formed in advance in the glass epoxy plates forming the first intermediate layers 12a and 12b so that the cavities are formed after stacking. The first intermediate layer 12a on the lower layer side has one opening O in each unit, and the first intermediate layer 12b on the upper layer side has one of each of large and small openings O in each unit. These openings are easily formed by performing simultaneous punching during the cutting process for shaping the two first intermediate layers. Two first cavities 15a and 15b are provided in one semiconductor package 100 (see FIG. 6) after division. The first cavity 15a is small and deep and the first cavity 15b is large and shallow. In other words, the cavities have different depths from each other. The first cavity 15a having a large depth is obtained by forming the opening O in both the first intermediate layers 12a and 12b on the upper and lower layer sides, and the first cavity 15b having a small depth is obtained by forming the opening O only in the first intermediate layer 12b on the upper layer side. Accordingly, the shape of the cavities is determined when the first intermediate layers are shaped; therefore, it is possible to easily obtain a stable shape with high accuracy and good reproducibility. Consequently, there is no risk of contamination due to residue or the like during cutting.

Figure 5:
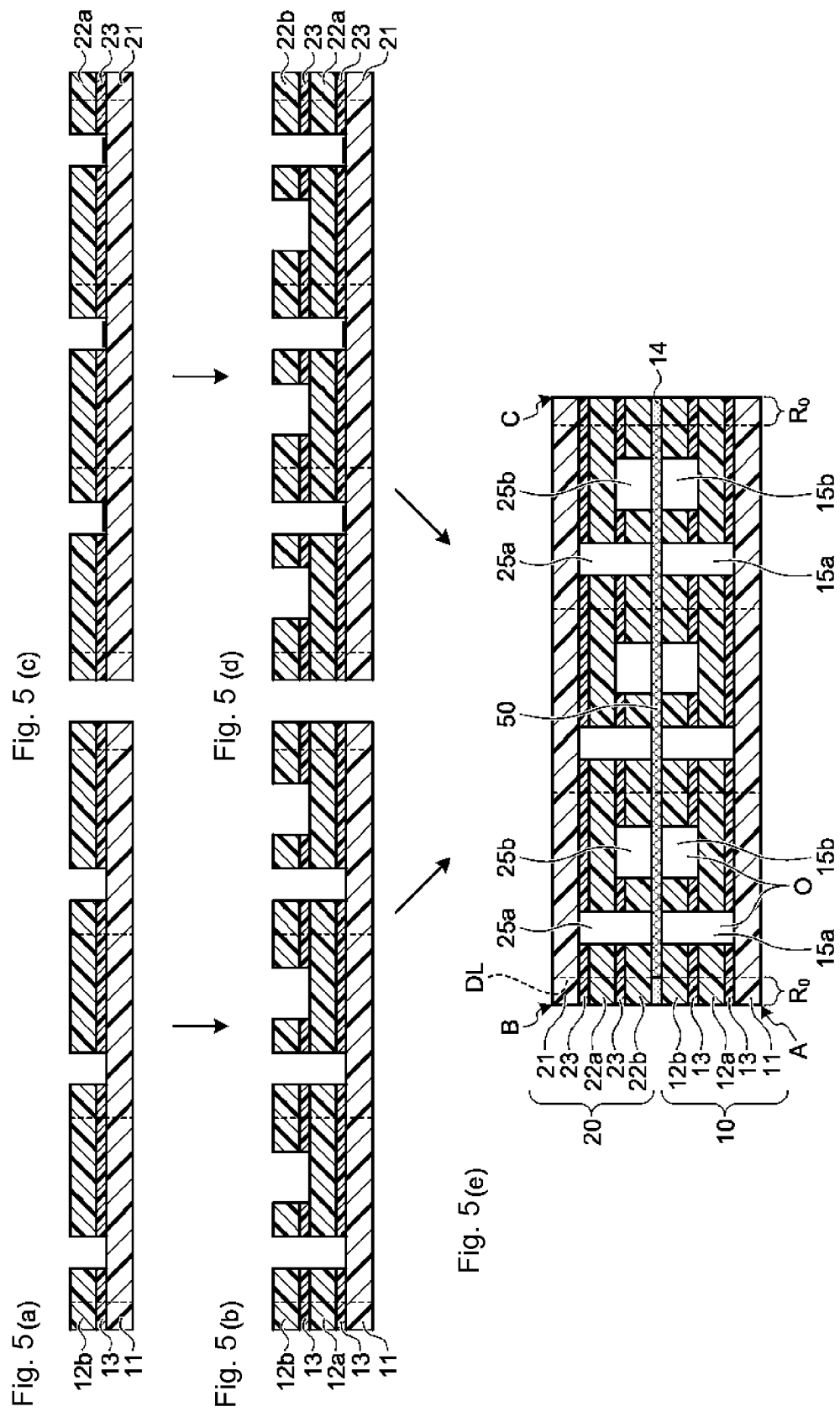
FIGS. 5(a), 5(b), 5(c), 5(d) and 5(e) are process cross sectional views illustrating part of the manufacturing process of the semiconductor packages according to the first embodiment.

The first insulating resin plate 11 and the first intermediate layers 12a and 12b formed in such a manner are stacked by using the epoxy adhesive films as the adhesive layers 13, whereby the first stacked body 10 is formed (FIGS. 5(a) and 5(b): Step S102).

When the second stacked body 20 is formed, in the same manner as the process of forming the first stacked body 10, wiring patterns are formed on one side or both sides of the glass epoxy plates that are the second insulating resin plate 21 and the second intermediate layers 22a and 22b (Step S201). In this embodiment, the pads 41 and 43 (not illustrated in FIG. 2, see FIGS. 7(b) and 7(c)) formed from copper wiring layer patterns are provided.

Then, the second insulating resin plate 21 and the second intermediate layers 22a and 22b are stacked by using the epoxy adhesive films as the adhesive layers 23, whereby the second stacked body 20 is formed (FIGS. 5(c) and 5(d): Step S202).

Thereafter, the release sheet 50, on which a melamine resin film is formed, is arranged on the surfaces of the first and second stacked bodies 10 and 20 such that the openings O forming the first and second cavities 15a and 15b (25a and 25b) face the release sheet 50. The epoxy adhesive film that is the adhesive 14 is provided between the release sheet 50 and the peripheral portions of the first and second stacked bodies 10 and 20. During the stacking process, a pressure of 5 MPa is applied to the first and second stacked bodies 10 and 20, and the first and second stacked bodies 10 and 20 are held for 90 minutes while being heated at 160° C. so as to bond the first and second stacked bodies 10 and 20 together (Step S103) as illustrated in FIG. 5(e). The adhesive 14 protruding from the epoxy adhesive film, which is the adhesive layer, during the stacking process is retained by the release sheet 50 and does not enter the first and second cavities 15a and 15b (25a and 25b). Moreover, provision of the release sheet 50 equalizes the pressure applied to the stacked bodies during the stacking process; therefore, the stacked bodies can be prevented from warping or recessing. This state is illustrated in FIG. 1(a).

Next, as illustrated in FIG. 1(b), the through holes 30 are formed, which penetrate the first stacked body 10 and the second stacked body 20 except for the bonding surface therebetween (Step S104). The through holes 30 are located at the peripheral portions of each semiconductor package unit, and the through holes 30 are provided along the dicing lines DL. Accordingly, the through holes 30 facilitate positioning as well as cutting. Moreover, it is possible to obtain a semiconductor package with a plurality of conductor layers formed on its side walls by dicing the stacked body after forming a plating layer on the inner walls of the through holes 30.

After the through holes 30 are formed in such a manner, as illustrated in FIG. 1(c), the inside of the through holes 30 and the top, side, and bottom surfaces of the stacked body of the first stacked body 10 and the second stacked body 20 are plated with copper so as to form a plating layer 40 (Step S105). At this point, the plating layer 40 is formed on the entire outer surface of the stacked body. However, the plating layer can be prevented from being formed on the side surface of the stacked body by immersing, in a plating bath, the stacked body around which a plating holder (not illustrated) is attached. The stacked body in the present embodiment is obtained by stacking the first and second stacked bodies 10 and 20.

Thereafter, as illustrated in FIG. 1(d), unnecessary copper-plated portions on the top surface and bottom surface of the first and second stacked bodies 10 and 20 are removed by etching and electrode patterns are formed (Step S106). Pads 40RP (see FIG. 7(b)) are formed on the bottom surface around the through holes 30.

Furthermore, as illustrated in FIG. 1(e), the top surface and the bottom surface of the first and second stacked bodies 10 and 20 are fixed such that the first and second stacked bodies 10 and 20 are compressed, and the peripheral regions $R_O$, which are cutting allowances of the stacked body, are removed by machining. Thereafter, the fixing of the bottom surface and the top surface is released; therefore, the first and second stacked bodies 10 and 20 can be separated from each other along the separation line $DL_H$ in the horizontal direction (Step S107).

After the separation, a solder resist is applied and is patterned (Step S108). In this embodiment, a photosensitive solder resist film is applied to the bottom surface and the top surface of the first and second stacked bodies 10 and 20 and the solder resist is patterned through exposure, development, and etching processes. Thereafter, the pads 41 and 43 and the like formed from copper wiring are plated with gold in order to protect them from oxidation (Step S109). The solder resist process and the gold plating process may be performed in reverse order.

Figure 6:
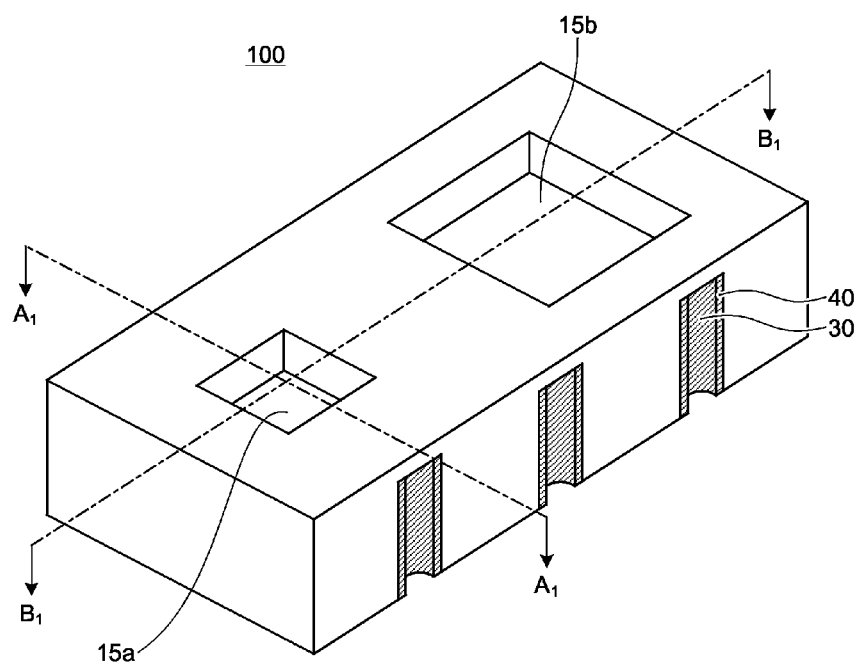
FIG. 6 is a perspective view illustrating a semiconductor package manufactured by the manufacturing process of the semiconductor packages according to the first embodiment.
Figure 7A:
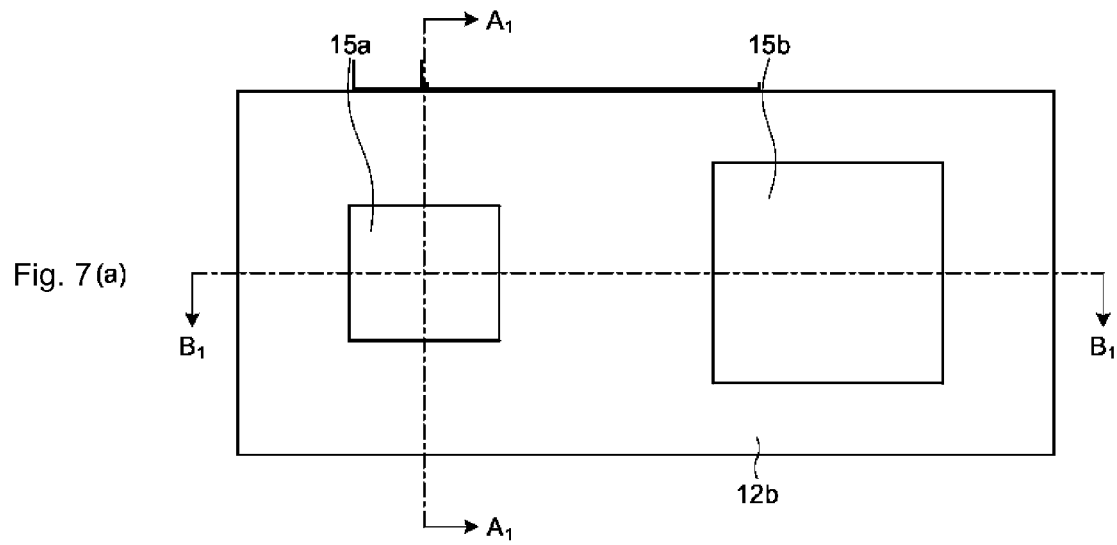
FIGS. 7(a), 7(b) and 7(c) are diagrams illustrating a semiconductor package manufactured by the manufacturing process of the semiconductor packages according to the first embodiment, where
Figure 7B:
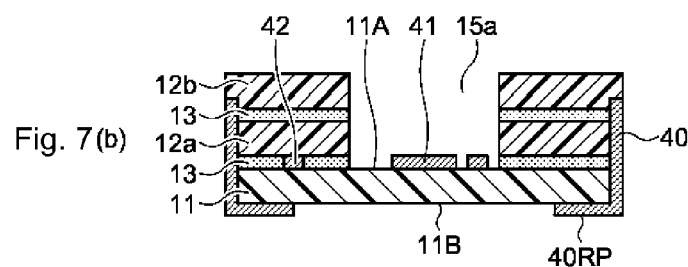
Figure 7C:
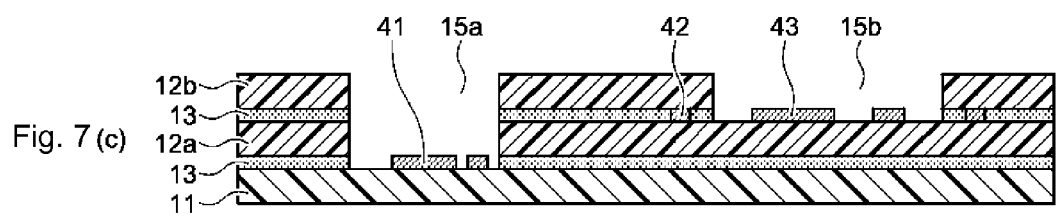

The first and second stacked bodies 10 and 20 are each divided by dicing so as to be singulated (Step S110), thereby obtaining the semiconductor packages 100 illustrated in FIG. 6 and FIG. 7. FIG. 6 is a perspective view, FIG. 7(a) is a top view, FIG. 7(b) is a cross-sectional view taken along line $A_1$-$A_1$ in FIG. 7(a), and FIG. 7(c) is a cross-sectional view taken along line $B_1$-$B_1$ in FIG. 7(a).

The semiconductor package formed in such a manner has the first cavity 15a or the second cavity 25a, which is deep and small and is used for mounting a light emitting element composed of an LED, and the first cavity 15b or the second cavity 25b, which is shallow and large and is used for mounting a light receiving element composed of a photodiode. The pad 41 formed from copper wiring is provided in the first cavity 15a and the second cavity 25a and the pad 43 formed from copper wiring is provided in the first cavity 15b and the second cavity 25b. Wiring 42 formed from a copper wiring layer is formed in advance in the first and second insulating resin plates 11 and 21.

Moreover, the plating layer 40 formed from copper plating is formed on the inner walls of the through holes 30, which are through holes. The plating layer 40 wraps around to back surfaces 11B of the first and second insulating resin plates 11 and 21 to form the pads 40RP for external connection (FIG. 7(b)). The surfaces of the pads 40RP for external connection are also covered with a gold plating layer by gold plating at Step S109 described above; therefore, solder connection is easy. The wiring and the circuit elements formed in the first and second insulating resin plates 11 and 21 and the first and second intermediate layers 12a, 12b, 22a, and 22b are connected to each other via the plating layer 40 on the side walls of the through holes; therefore, the wiring and the circuit elements can be externally connected by the pads 40RP for external connection. With the above configuration, the electrode that renders the electrode patterns on the respective layers of the semiconductor package conductive does not penetrate the stacked body and this structure does not allow a plating solution to easily enter the top surface of the semiconductor package. Therefore, the semiconductor package in the present embodiment has a structure with no electrode pattern on its top surface and the portion around the cavity opening of the top surface of the semiconductor package is flat and clean. Although it is important to form the through holes 30 such that part of the bonding surface between the first and second stacked bodies 10 and 20 remains, it is desirable that the thickness of the part is approximately equal to or more than half the thickness of the intermediate layer and equal to the thickness of the intermediate layer. Accordingly, it is possible to prevent the plating layer from wrapping around to the bonding surface, i.e., the top surface of the semiconductor package, and the wiring can be efficiently drawn from the intermediate layer.

Figure 8:
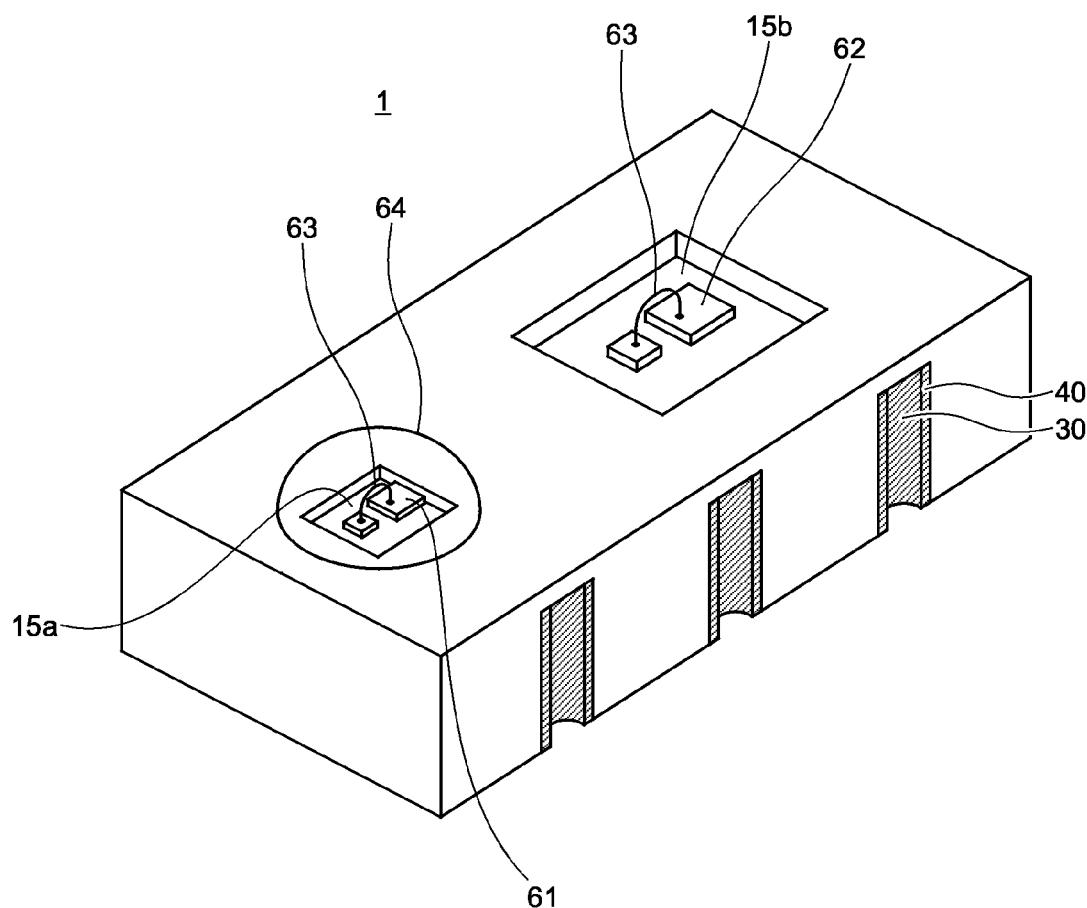
FIG. 8 is a perspective view illustrating an optical module mounted using the semiconductor package according to the first embodiment.

FIG. 8 is a diagram illustrating an optical transceiver module in which the semiconductor package according to the present embodiment is used. In an optical transceiver module 1, a light emitting element 61 and a light receiving element 62 are mounted on the semiconductor package 100 illustrated in FIG. 6 and FIGS. 7(a) to 7(c) and a lens 64 is bonded to the opening of the cavity in which the light emitting element 61 is housed. The lens 64 is a molded product and is bonded with an adhesive. Alternatively, the lens 64 may be molded from resin so as to cover the cavity in which the light emitting element is housed. The light emitting element 61 composed of an LED is mounted on the pad 41 provided in the first cavity 15a and is wire-bonded with a wire 63. The light receiving element 62 composed of a photodiode is mounted on the pad 43 provided in the first cavity 15b, which is shallow and large, and is wire-bonded with the wire 63. The first cavity 15b in which the light receiving element 62 is mounted is filled with a translucent resin (not illustrated), thereby protecting the bonding wire.

In the optical transceiver module 1 formed in such a manner, circuits can be connected using the pads 40RP for external connection by surface mounting them on the wiring substrate. The optical transceiver module 1 according to the present embodiment is, for example, used as a sensor that determines the state, such as the presence or absence of a target object and the surface state. Examples of the sensor include a sensor that detects the rotational angle of a servo motor by emitting light to a target object from the light emitting element 61 and detecting the reflected light by the light receiving element 62. A reflective film can be formed on the inner walls of the first and second cavities and an optical element, such as a lens, can be formed on the top surfaces of the cavities.

According to the manufacturing method of the semiconductor package in the present embodiment, an adhesive layer is formed by applying the adhesive 14 only to the peripheral regions $R_0$ of the first and second stacked bodies, the first and second stacked bodies are bonded together, the plating process is performed in a state where the cavities form sealed spaces, and then the first and second stacked bodies are each divided after the plating process is finished; therefore, semiconductor packages are manufactured extremely easily and adhesion of the plating layer to the inside of the cavities is definitely prevented. Moreover, because the peripheral regions $R_0$, which are bonding portions, become cutting allowances, i.e., removal regions, the surface does not become rough because of the division; therefore, it is possible to obtain semiconductor packages with high reliability. Furthermore, although, in Patent Literature 1, it is necessary to perform the removing process for forming the cavities, according to the present embodiment, the cavities with high accuracy can be collectively formed only by forming openings in the intermediate layers when the stacked bodies are formed. Moreover, because dust generated by cutting does not remain, the smoothness of the cavity surfaces improves and the bonding reliability in the die bonding and wire bonding of the semiconductor packages can be improved. Therefore, the manufacturing costs can be significantly reduced and thus semiconductor packages can be manufactured at low cost. Moreover, when a plurality of cavities having different depths are formed, the depth can be adjusted only by determining whether to form an opening in the intermediate layers; therefore, it is possible to easily form semiconductor packages with high accuracy and reliability.

Moreover, according to the semiconductor package in the present embodiment, when the through holes are formed in the first and second stacked bodies, the through holes are formed such that the bonding surface remains so as to prevent a plating layer from being formed on the bonding surface, i.e., the cavity formation surface. Thus, the electrode that renders the electrode patterns on the respective layers of the semiconductor package conductive does not penetrate the stacked body; therefore, the semiconductor package has a structure with no electrode pattern on its top surface. Accordingly, the portion around the cavity opening of the top surface of the semiconductor package is flat and clean. Consequently, when an optical element, such as a lens, is bonded to the top surface of the semiconductor package, high reliability can be obtained.

Second Embodiment

Figure 9:
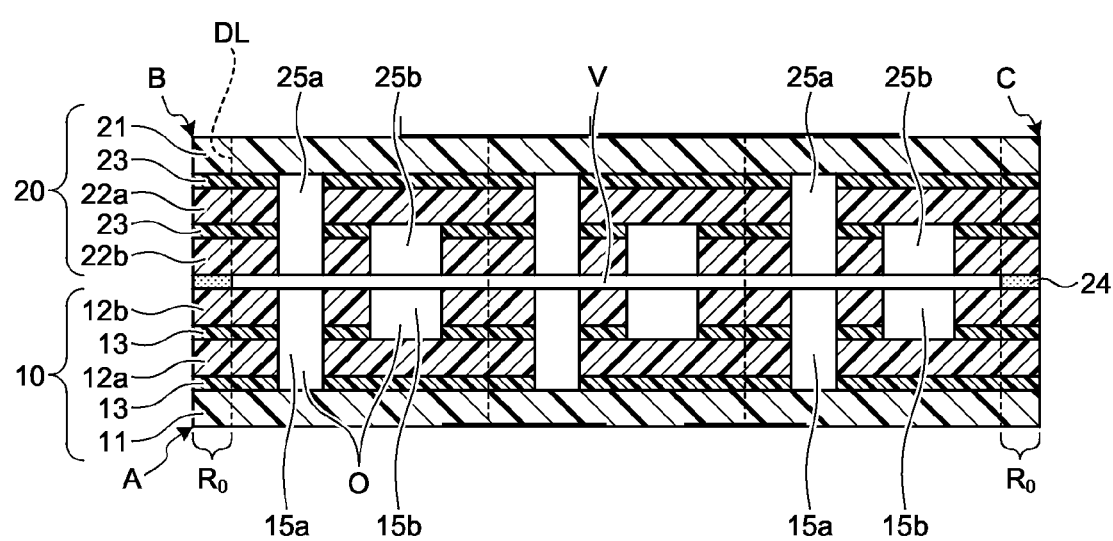
FIG. 9 is an explanatory diagram illustrating a manufacturing process of semiconductor packages according to a second embodiment and is a cross-sectional view illustrating a state where the semiconductor packages are cut along line A-B-C in FIGS. 1(a) and 1(b).

FIG. 9 is a main-part cross-sectional view illustrating a manufacturing process of stacked semiconductor packages according to a second embodiment. The present embodiment is different from the first embodiment in that when the first and second stacked bodies are formed, the first and second stacked bodies are bonded together by applying an adhesive 24 only to the peripheral regions $R_O$ and thereby forming an adhesive layer without providing a release sheet between the first and second stacked bodies. Accordingly, when the semiconductor packages are manufactured, the first and second stacked bodies are not formed in advance, but the first and second insulating resin plates and the first and second intermediate layers are sequentially stacked so as to form the state in which the first and second stacked bodies are stacked. Other processes are similar to those in the first embodiment. The same reference numerals are given to the same components.

In the present embodiment, glass epoxy plates are used for the first and second insulating resin plates 11 and 21 in a similar manner to the first embodiment; however, a thermosetting epoxy adhesive is used for the adhesive 24. In the present embodiment, the openings O are formed in advance in the first and second intermediate layers 12a, 12b, 22a, and 22b so that the first and second cavities 15a, 15b, 25a, and 25b are formed after stacking. The adhesive 24 is applied only to the stacked body peripheral portions between the first and second stacked bodies 10 and 20 and there is an air gap V on the inner side of the adhesive 24 (a release sheet is not present). Although the through holes are not illustrated, in a similar manner to the first embodiment, the through holes are formed in the first and second stacked bodies 10 and 20 from the bottom surface toward the top surface to penetrate the stacked bodies such that part of the top surfaces of the stacked bodies, i.e., part of the cavity formation surfaces, remains.

Although the release sheet 50 is not provided, the adhesive 24 does not flow out by adjusting the amount of applied adhesive 24. In the present embodiment, an adhesive layer is formed by applying the adhesive 24 only to the peripheral regions $R_O$, which are cutting allowances. At the same time as the peripheral regions $R_O$ are removed, the first and second stacked bodies 10 and 20 are separated in the horizontal direction, and the adhesive 24 does not remain. In a similar manner to the first embodiment, the first and second stacked bodies 10 and 20 are each diced into three rows and three columns along the dicing lines DL, whereby the semiconductor packages 100 similar to that illustrated in the perspective view in FIG. 6 is obtained. Accordingly, even with the present embodiment, it is possible to obtain semiconductor packages with high reliability extremely easily.

Third Embodiment

Figure 10A:
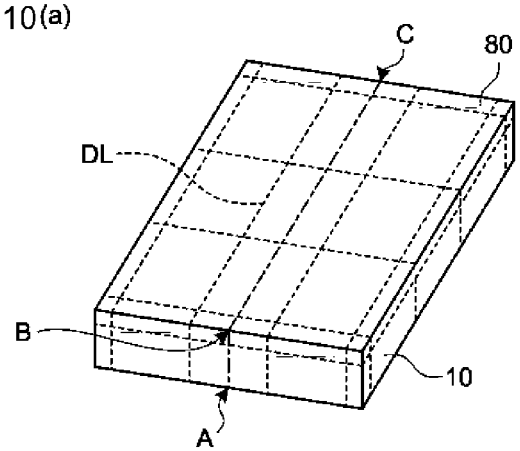
FIGS. 10(a), 10(b), 10(c), 10(d) and 10(e) are explanatory diagrams illustrating a manufacturing process of semiconductor packages according to a third embodiment.
Figure 10D:
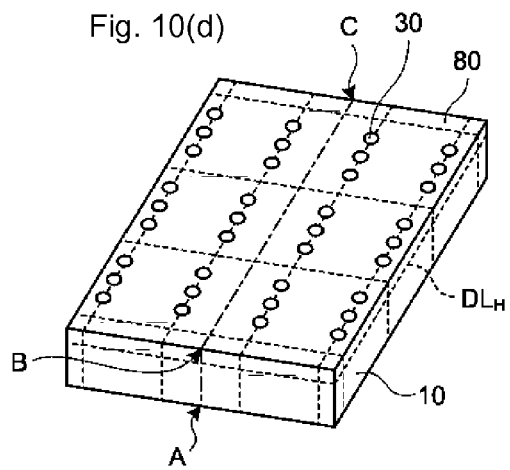
Figure 11:
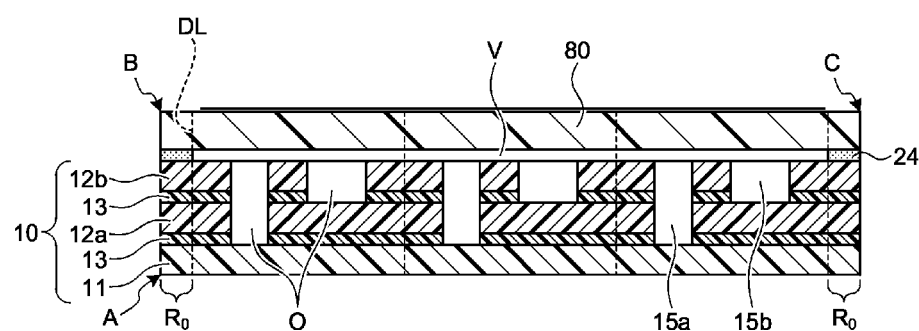
FIG. 11 is a cross-sectional view illustrating a state where the semiconductor packages are cut along line A-B-C in FIGS. 10(a) and 10(b).
Figure 12:
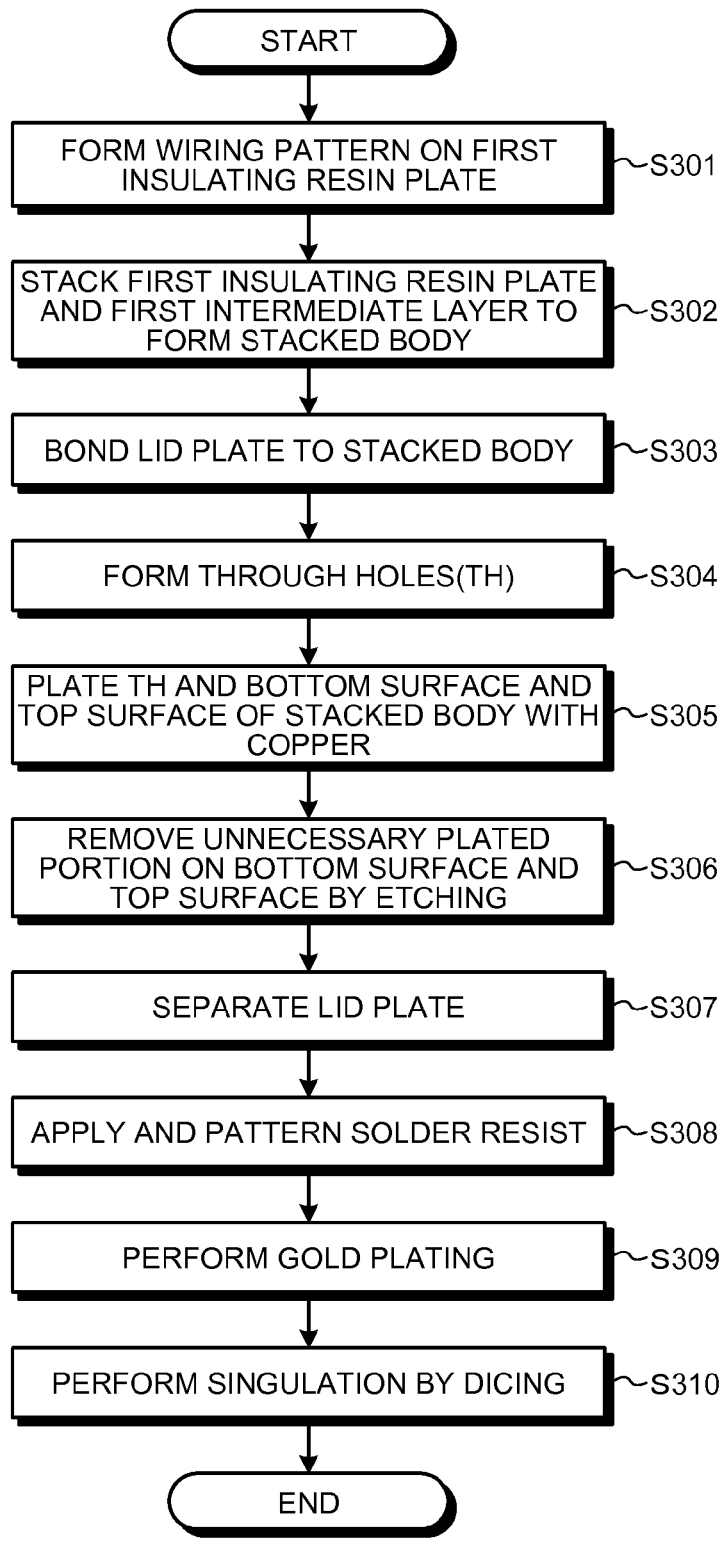
FIG. 12 is a flowchart illustrating a manufacturing process of the semiconductor packages according to the third embodiment.
Figure 13:
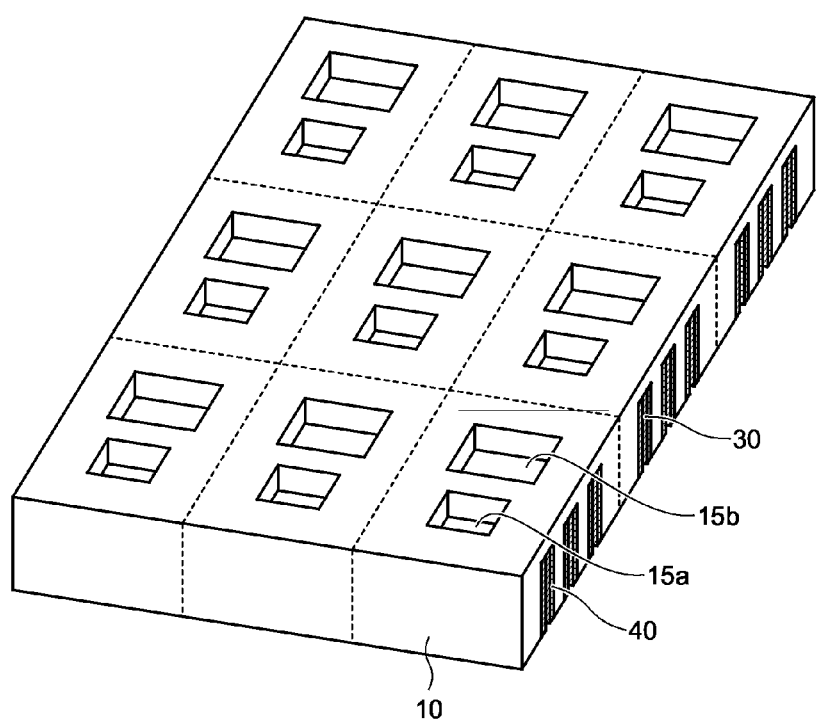
FIG. 13 is a perspective view illustrating semiconductor packages before being diced that are manufactured by the manufacturing process of the semiconductor packages according to the third embodiment.
Figure 14A:
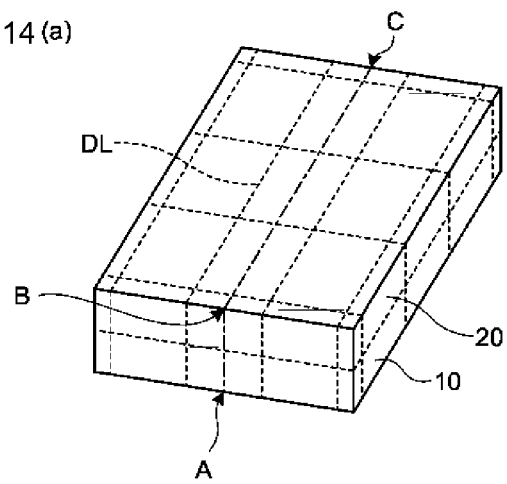
FIGS. 14(a), 14(b), 14(c), 14(d) and 14(e) are explanatory diagrams illustrating a manufacturing process of semiconductor packages according to a fourth embodiment.
Figure 14B:
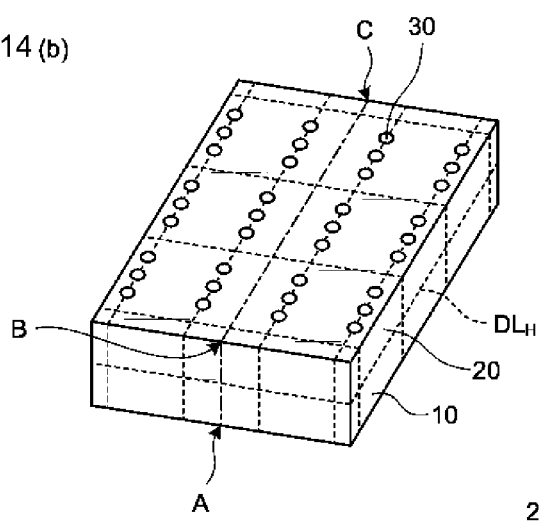
Figure 14C:
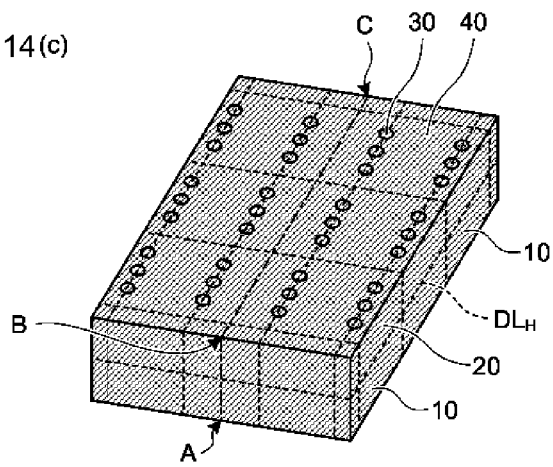
Figure 14D:
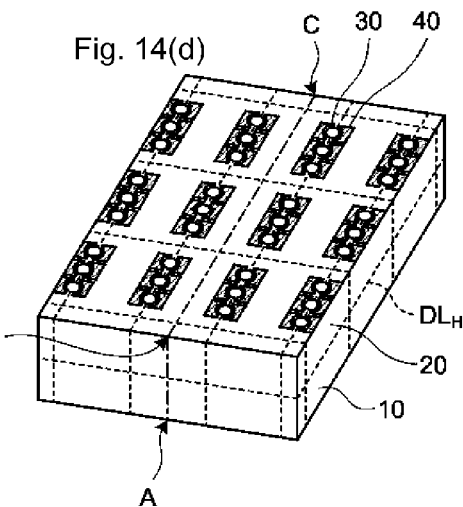
Figure 14E:
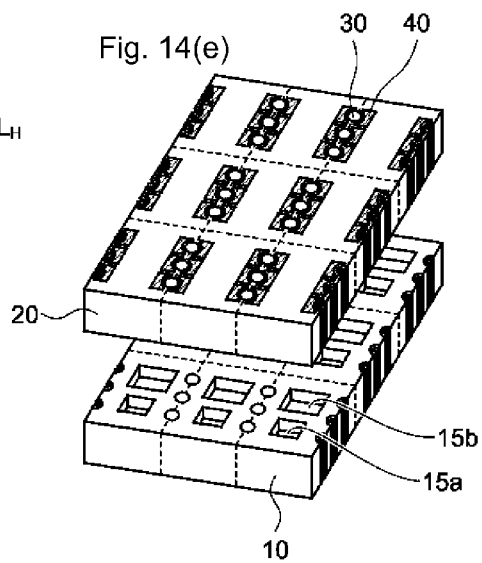

FIG. 10 is a diagram illustrating a manufacturing method of stacked semiconductor packages according to a third embodiment. FIG. 11 is a cross-sectional view illustrating a state where the semiconductor packages are cut along line A-B-C in FIGS. 10(a) and 10(b). FIG. 12 is a flowchart illustrating a manufacturing process of the semiconductor packages according to the third embodiment. FIG. 13 is a diagram illustrating a stacked body before being diced into the semiconductor packages manufactured by the manufacturing process of the semiconductor packages according to the third embodiment. The present embodiment is characterized in that a lid plate 80 is used to cover two types of cavities, i.e., the first cavities 15a and 15b formed in the first stacked body 10. Other portions are similar to those in the first embodiment. The same reference numerals are given to the same components.

As illustrated in the cross-sectional view in FIG. 11, in a similar manner to the first embodiment, the first stacked body 10, in which the first intermediate layers 12a and 12b formed with the adhesive layer 13 therebetween are stacked on the first insulating resin plate 11 with the adhesive layer 13 therebetween, is formed as a stacked body to have a one-step structure. In this embodiment, the lid plate 80 is bonded to the first stacked body 10 with the adhesive 24 such that the first cavities 15a and 15b are covered, through holes, i.e., the through holes 30 (not illustrated in FIG. 11), are formed in a state where the cavities form sealed spaces, and the through holes are plated. At this point, the first cavities 15a and 15b are sealed spaces in the stacked body; therefore, plating does not adhere thereto. The peripheral regions $R_O$, which are cutting allowances, are removed and the stacked body is separated at the border at which the adhesive disappears. The stacked body separated from the lid plate is singulated by dicing or the like along the dicing lines DL, and thereby semiconductor packages having cavities are manufactured. The first cavities 15a and 15b are exposed by separating and removing the lid plate 80 from the first stacked body 10. In the present embodiment, although the through holes 30 are formed without penetrating the bonding surface such that the bonding surface remains, they are referred to as through holes for the sake of convenience.

Next, an explanation will be given in detail of the manufacturing process of the semiconductor packages according to the third embodiment with reference to the flowchart illustrated in FIG. 12. In a similar manner to the first embodiment, a glass epoxy plate (MCL-E679FG made by Hitachi Chemical Co., Ltd.) (the first insulating resin plate 11) is used for the insulating resin plate. As with the first insulating resin plate 11, glass epoxy plates (MCL-E679FG made by Hitachi Chemical Co., Ltd.) are used for the first intermediate layers 12a and 12b. An epoxy adhesive film (AS-2600W made by Hitachi Chemical Co., Ltd.) is used for the adhesive layer (represented by reference numeral 13 in FIG. 11). In this embodiment, as with the adhesive layer that bonds the insulating resin plate and the intermediate layer, an epoxy adhesive film (AS-2600W made by Hitachi Chemical Co., Ltd.) is used for the adhesive 24 that is used for bonding the first stacked body 10 and the lid plate 80.

First, the pads 41 and 43 and the like (not illustrated in FIG. 11), which are copper wiring layer patterns, are provided on one side or both sides of the glass epoxy plates that are the first insulating resin plate 11 and the first intermediate layers 12a and 12b to form wiring patterns (Step S301). Moreover, although not illustrated, through holes are provided in the first intermediate layers 12a and 12b so as to connect the wiring layers to each other. Moreover, the openings O are formed in advance in the glass epoxy plates forming the first intermediate layers 12a and 12b so that the cavities are formed after stacking. The first intermediate layer 12a on the lower layer side has one opening O in each unit, and the first intermediate layer 12b on the upper layer side has one of each of large and small openings O in each unit. These openings are easily formed by performing simultaneous punching during the cutting process for shaping the first intermediate layers. Two first cavities 15a and 15b are provided in one semiconductor package 100 after division. The first cavity 15a is small and deep and the first cavity 15b is large and shallow. In other words, the cavities have different depths.

The first insulating resin plate 11 and the first intermediate layers 12a and 12b formed in such a manner are stacked by using the epoxy adhesive films as the adhesive layers 13, whereby the first stacked body 10 that is a stacked body is formed (Step S302).

Thereafter, the lid plate 80 formed from the same material as that of the first insulating resin plate 11 is arranged on the first stacked body 10 that is a stacked body such that the openings forming the first cavities 15a and 15b face the lid plate 80. The epoxy adhesive film that is the adhesive 24 is provided between the lid plate 80 and the peripheral portions of the stacked body. During the stacking process, a pressure of 5 MPa is applied to the first stacked body 10 and the lid plate 80, and the first stacked body 10 and the lid plate 80 are held for 90 minutes while being heated at 160° C. so as to bond the first stacked body 10 and the lid plate 80 together (Step S303) as illustrated in FIG. 10(a).

Figure 10B:
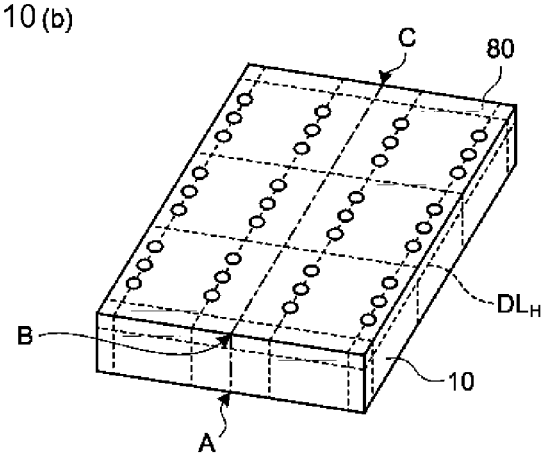

Next, as illustrated in FIG. 10(b), the through holes 30 are formed, which penetrate the lid plate 80 from the first stacked body 10 (Step S304). In this embodiment, the through holes 30 are formed on the inner side of the peripheral regions in which the adhesive 24 is formed such that part of the intermediate layer including the bonding surface between the first stacked body 10 and the lid plate 80 remains. It is desirable that the thickness of the part of the intermediate layer is approximately equal to or more than half the thickness of the intermediate layer and equal to the thickness of the intermediate layer. Accordingly, it is possible to prevent the plating layer from wrapping around to the bonding surface, i.e., the top surface of the semiconductor package, and the wiring can be efficiently drawn from the intermediate layer.

Figure 10E:
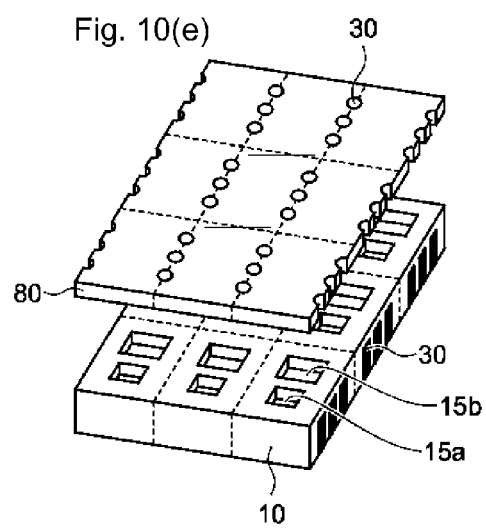
Figure 10C:
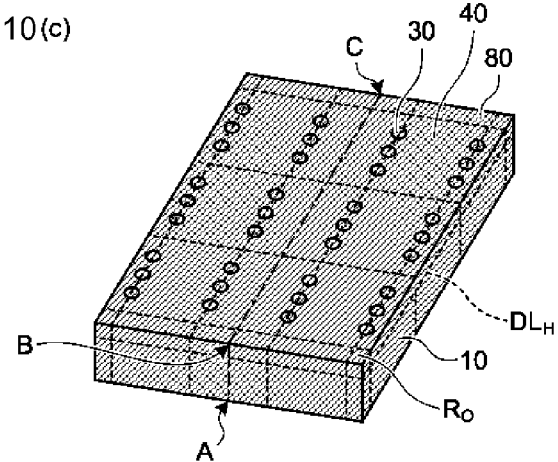

After the through holes 30 are formed in such a manner, as illustrated in FIG. 10(c), the inside of the through holes 30 and the top, side, and bottom surfaces of the stacked body of the first stacked body 10 and the lid plate 80 are plated with copper so as to form the plating layer 40 (Step S305). At this point, the plating layer 40 is formed on the entire outer surface of the stacked body. However, the plating layer can be prevented from being formed on the side surface of the stacked body by immersing, in a plating bath, the stacked body around which a plating holder (not illustrated) is attached.

Thereafter, as illustrated in FIG. 10(d), unnecessary copper-plated portions on the top surface and bottom surface of the first stacked body 10 are removed and electrode patterns are formed (Step S306). Pads are formed on the bottom surface around the through holes 30.

Furthermore, as illustrated in FIG. 10(e), the top surface and the bottom surface of the stacked body are fixed such that the first stacked body 10 is compressed, and the peripheral regions $R_O$, which are cutting allowances of the stacked body, are removed by machining. Thereafter, the fixing of the bottom surface and the top surface is released; therefore, the first stacked body 10 can be separated from the lid plate 80 along the separation line $DL_H$ in the horizontal direction and thus the lid body is separated from the first stacked body (Step S307).

After the separation, a solder resist is applied and is patterned (Step S308). In this embodiment, a photosensitive solder resist film is applied to the bottom surface and the top surface of the first stacked body 10 and the solder resist is patterned through exposure, development, and etching processes. Thereafter, the pads 41 and 43 and the like formed from copper wiring are plated with gold in order to protect them from oxidation (Step S309). The solder resist process and the gold plating process may be performed in reverse order.

The first stacked body 10 obtained in such a manner is illustrated in FIG. 13. The first stacked body 10 is singulated by dicing (Step S310), thereby obtaining the semiconductor packages 100 similar to those illustrated in FIG. 6 and FIG. 7.

According to the present embodiment, it is possible to easily plate the through holes of the stacked body having one stage with high reliability.

The number of stages of the stacked body is not limited to one and an odd number of three or more stages can be provided. In such a case, it is satisfactory if the cavities are not exposed, and the stacked body may have a portion in which cavities do not face each other.

Fourth Embodiment

Figure 15:
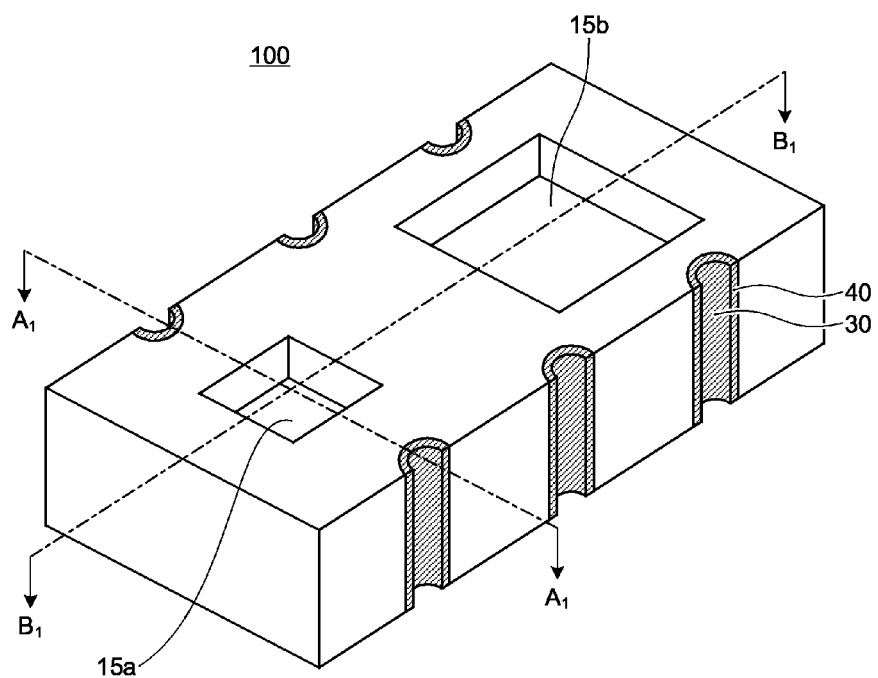
FIG. 15 is a perspective view illustrating a semiconductor package manufactured by the manufacturing process of the semiconductor packages according to the fourth embodiment.

FIG. 14 is a diagram illustrating a manufacturing method of stacked semiconductor packages according to a fourth embodiment and FIG. 15 is a perspective view illustrating a semiconductor package formed by the above method.

In the first embodiment, through holes, i.e., the through holes 30 in the semiconductor packages, are provided such that the part including the bonding surface between the first and second stacked bodies 10 and 20 remains. In contrast, in the method according to the present embodiment, the through holes 30 of the semiconductor packages are provided such that they penetrate the first and second stacked bodies 10 and 20, which is different from the other embodiments. Other portions are similar to those in the first embodiment. In the present embodiment, when a plating layer is formed, the stacked plates (first and second stacked bodies) are stacked on each other with their cavities facing the inner side and are bonded together by applying an adhesive to the peripheral regions thereof so that the cavities of the stacked plates form sealed spaces, and then the through holes are plated, in a similar manner to the first embodiment. In such a case, the plating layer 40 is formed on the through holes 30 that are formed continuously through the entire first and second stacked bodies 10 and 20 in the thickness direction of the first and second stacked bodies 10 and 20. Then, when the first and second stacked bodies are separated, the peripheral regions $R_O$ bonded with an adhesive are removed as cutting allowances, i.e., removal regions. In such a manner, the first and second stacked bodies 10 and 20 are separated and they are each divided into a plurality of pieces so as to form the semiconductor packages.

When the first and second stacked bodies 10 and 20 are separated, it is difficult in some cases to divide the plating layer 40 formed on the through holes 30 continuously. Therefore, for example, by using a method of interposing a release sheet at the bonding surface between the first and second stacked bodies 10 and 20 and preventing the plating layer 40 from being formed on the release sheet or a method of bonding the first and second stacked bodies with an adhesive that is easily released by, for example, increasing the temperature, it is possible to have a structure in which the electrode that renders the electrode patterns on the respective layers of the semiconductor package conductive is formed as a through-hole electrode and an electrode pattern is formed on the top surface of the semiconductor package. Accordingly, with such a semiconductor package, connection wiring is facilitated on the side on which the first and second cavities are formed, enabling a reduction in wiring length.

In the first to fourth embodiments, an epoxy resin is not the only example of bonding the insulating resin plate and the intermediate layer, and they may be bonded together with prepreg (fiber impregnated with resin). Moreover, the insulating resin plate and intermediate layer themselves can be made of prepreg and cavities can be formed by cutting the cavity formation regions of the intermediate layer with a laser.

Any publicly known substrate can be used as the insulating resin plate. It is satisfactory if the insulating resin plate is shape-retaining. The material of the substrate is not particularly limited and examples thereof include a high-polymer material (such as cellulose diacetate, cellulose triacetate, cellulose propionate, cellulose butyrate, cellulose acetate, cellulose nitrate, polyethylene terephthalate, polyethylene, polystyrene, polypropylene, polyvinyl acetal, polyimide, epoxy, bismaleimide resin, polyphenylene oxide, liquid crystal polymer, and polytetrafluoroethylene), other materials (such as paper and plastic laminated paper), a combination thereof, and materials similar thereto.

The semiconductor packages according to the first to fourth embodiments can be used as packages for various semiconductor elements, such as a high-frequency module, in addition to optical modules, such as an optical transceiver module. When the semiconductor packages are used for such purposes, it is preferable to use a substrate including an insulating resin to be described below, specifically, a substrate (insulating substrate) formed from an insulating resin or a substrate (substrate having an insulating resin layer) having a layer formed from an insulating resin (insulating resin layer) on its surface. The insulating resin plate may be a substrate in which a metal wiring layer and an insulating resin layer are arranged alternately on the surface thereof and an insulating resin layer is arranged on the uppermost layer.

Specific examples of the insulating resin include a thermosetting resin, a thermoplastic resin, and a mixture thereof. Examples of a thermosetting resin include an epoxy resin, a phenolic resin, a polyimide resin, a polyester resin, a bismaleimide resin, a polyolefin resin, an isocyanate resin, and an ABS resin. Examples of an epoxy resin include a cresol novolac epoxy resin, a bisphenol A epoxy resin, a bisphenol F epoxy resin, a phenol novolac epoxy resin, an alkylphenol novolac epoxy resin, a biphenol F epoxy resin, a naphthalene epoxy resin, a dicyclopentadiene-type epoxy resin, an epoxy compound of a condensation product of phenols and aromatic aldehydes having phenolic hydroxyl groups, and a cycloaliphatic epoxy resin. They can be used alone or in combination of two or more thereof.

In addition to a thermosetting resin, such as an epoxy resin, it is possible to use a thermoplastic resin as the adhesive layer. Examples of a thermoplastic resin include a phenoxy resin, polyethersulfone, polysulfone, polyphenylene sulfone, polyphenylene sulfide, polyphenylether, and polyetherimide.

In the first to fourth embodiments, because the same material can be used for the adhesive layer used for bonding the insulating resin plate and the intermediate layer and the adhesive used for bonding the stacked bodies together or for bonding the stacked body and the lid plate, the bonding workability is excellent. Even when the same material is used for the adhesive layer used for bonding the insulating resin plate and the intermediate layer and the adhesive used for bonding the stacked bodies together or for bonding the stacked body and the lid plate so that they are firmly bonded together, the bonding portions in the peripheral regions are removed as cutting allowances; therefore, they can be separated easily with good workability. Consequently, it is possible to obtain semiconductor packages having smooth surfaces that are free from contamination.

In the first to fourth embodiments, the same material may be used for the adhesive layer that is used for bonding the insulating resin plate and the intermediate layer and the adhesive that is used for bonding the stacked bodies together or for bonding the stacked body and the lid plate; however, different materials may be used for the adhesive layer and the adhesive. For example, it is possible to use adhesives having different melting temperatures such that the melting temperature of the adhesive for bonding the first and second stacked bodies together or bonding the stacked body and the lid plate is lower than the melting temperature of the adhesive layer between the layers and to separate the first and second stacked bodies or the stacked body and the lid plate along the separation line by heating. Alternatively, the first and second stacked bodies or the stacked body and the lid plate may be mechanically separated from each other by laser processing, a wire saw, or the like.

Furthermore, in the first to fourth embodiments, it is also effective to use a stacked body that is obtained by forming a built-up layer on the outermost layer after the through holes are plated.

In the first to third embodiments, when the through holes are formed in the first and second stacked bodies, the through holes are formed such that part of the first and second stacked bodies including the bonding surface remains and the plating layer is prevented from being formed on the bonding surface, i.e., the cavity formation surface. Accordingly, the electrode that renders the electrode patterns on the respective layers of the semiconductor package conductive does not penetrate the stacked body; therefore, the semiconductor package has a structure with no electrode pattern on its top surface. In contrast, with the method according to the fourth embodiment, for example, by using a method of preventing the plating layer from being formed on the release sheet on the bonding surface or a method of bonding the first and second stacked bodies with an adhesive that is easily released by, for example, increasing the temperature, it is possible to have a structure in which the electrode that renders the electrode patterns on the respective layers of the semiconductor package conductive is formed as a through-hole electrode and an electrode pattern is formed on the top surface of the semiconductor package. Accordingly, connection wiring is facilitated on the surface side, enabling a reduction in wiring length.

Some embodiments of the present invention have been described. However, these embodiments are presented as examples and are not intended to limit the scope of the invention. These novel embodiments can be implemented in other various forms, and various omissions, replacements, and changes can be made without departing from the spirit of the present invention. These embodiments and their modifications are included in the scope and spirit of the present invention and are also included in the invention described in the claims and its equivalents.

INDUSTRIAL APPLICABILITY

As described above, according to the manufacturing method of the semiconductor package of the present embodiments, it is possible to form semiconductor packages with cavities that have a high accuracy and are not contaminated because of the adhesion of plating; therefore, the semiconductor packages can be used for mounting various semiconductor elements, such as an optical transceiver module and a high-frequency module.

REFERENCE SIGNS LIST 10 first stacked body, 11 first insulating resin plate, 12a, 12b first intermediate layer, 13 adhesive layer, 14 adhesive, 15a, 15b first cavity, 25a, 25b second cavity, 20 second stacked body, 21 second insulating resin plate, 22a, 22b second intermediate layer, 23 adhesive layer, 30 through hole, 40 plating layer, 50 release sheet, 61 light emitting element, 62 light receiving element, 63 wire, 80 lid plate, DL dicing line, $DL_H$ separation line in horizontal direction.

What is claimed is:

1. A manufacturing method of a semiconductor package, comprising:
    forming a first stacked body including a first insulating resin plate having first and second main surfaces and a first intermediate layer that is stacked on the second main surface and that has an opening forming at least one first cavity;
    forming a second stacked body including a second insulating resin plate having first and second main surfaces and a second intermediate layer that is stacked on the second main surface and that has an opening forming at least one second cavity;
    selectively forming an adhesive in a peripheral region of at least one of the first and second intermediate layers and bonding the first and second intermediate layers together such that the first and second cavities are covered with each other;
    forming a through hole on an inner side of the peripheral region, the through hole penetrating the first and second stacked bodies such that part of the first and second stacked bodies including a bonding surface between the first and second stacked bodies remains;
    forming a plating layer on the through hole; and
    dividing each of the first and second stacked bodies along a dicing line that includes the through hole and penetrates the first and second stacked bodies, wherein
    a first package having the first cavity and a second package having the second cavity are formed.

2. The manufacturing method of a semiconductor package according to claim 1, wherein regions of the first and second intermediate layers, on which the adhesive is not formed, are bonded together with a release sheet therebetween.

3. The manufacturing method of a semiconductor package according to claim 1, wherein
    the forming the first and second stacked bodies includes
    shaping the first and second intermediate layers that each have an opening penetrating a corresponding layer, and
    stacking the first and second intermediate layers on the first and second insulating resin plates, respectively, with an adhesive layer therebetween.

4. The manufacturing method of a semiconductor package according to claim 3, wherein the adhesive layer is a thermosetting resin.

5. The manufacturing method of a semiconductor package according to claim 4, wherein the first and second insulating resin plates are a glass epoxy substrate.

6. The manufacturing method of a semiconductor package according to claim 1, wherein the dividing each of the first and second stacked bodies includes dividing each of the first and second stacked bodies into a plurality of semiconductor packages.

7. The manufacturing method of a semiconductor package according to claim 1, wherein the first intermediate layer includes a plurality of openings within one region that is separated along the dicing line.

8. The manufacturing method of a semiconductor package according to claim 7, wherein
    the first intermediate layer includes a plurality of layers,
    the first intermediate layer includes, within one region that is separated along the dicing line, a first opening that does not penetrate an outermost layer among the plurality of layers and a second opening that penetrates the outermost layer, and
    a semiconductor package having a plurality of cavities having different depths is formed.

9. A manufacturing method of a semiconductor package, comprising:
    forming a first stacked body including a first insulating resin plate having first and second main surfaces and a first intermediate layer that is stacked on the second main surface and that has an opening forming at least one first cavity;
    forming a second stacked body including a second insulating resin plate having first and second main surfaces and a second intermediate layer that is stacked on the second main surface and that has an opening forming at least one second cavity;
    selectively forming an adhesive in a peripheral region of at least one of the first and second intermediate layers and bonding the first and second intermediate layers together such that the first and second cavities are covered with each other;
    forming a through hole on an inner side of the peripheral region, the through hole penetrating the first and second stacked bodies;
    forming a plating layer on the through hole; and
    dividing each of the first and second stacked bodies along a dicing line that includes the through hole and penetrates the first and second stacked bodies, wherein
    a first package having the first cavity and a second package having the second cavity are formed.

* * * * *